(12) United States Patent
Sim et al.

(10) Patent No.: US 6,222,736 B1
(45) Date of Patent: Apr. 24, 2001

(54) COMPUTER WITH COMPONENT INSTALLATION HANDLE

(75) Inventors: Vibora Sim, Pflugerville; Steve Sands, Austin, both of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/237,343

(22) Filed: Jan. 26, 1999

(51) Int. Cl.[7] ........................................... G06F 1/16
(52) U.S. Cl. ............................. 361/727; 361/732
(58) Field of Search .................... 361/724–727, 361/731, 732

(56) References Cited

U.S. PATENT DOCUMENTS

| | | |
|---|---|---|
| 4,985,806 | 1/1991 | Mazzullo et al. . |
| 5,020,151 * | 5/1991 | Sampei et al. . |
| 5,593,220 | 1/1997 | Seid et al. . |
| 5,654,873 * | 8/1997 | Smithson et al. ................ 361/727 X |
| 5,754,396 | 5/1998 | Felcman et al. . |
| 5,761,045 | 6/1998 | Olson et al. . |
| 5,777,848 | 7/1998 | McAnally et al. . |
| 5,790,372 | 8/1998 | Dewey et al. . |
| 5,791,753 * | 8/1998 | Paquin . |
| 5,993,241 * | 11/1999 | Olson et al. . |
| 6,040,981 * | 3/2000 | Schmitt et al. ................ 361/727 X |

* cited by examiner

*Primary Examiner*—Jeffrey Donels
(74) *Attorney, Agent, or Firm*—Haynes and Boone, L.L.P.

(57) ABSTRACT

A computer, or other electronic device, according to which a handle is pivotally mounted to a component, such as a power supply, for installing the component supply in the computer chassis. After the component is inserted in the chassis, the handle is pivoted towards the component which establishes a fulcrum for forcing the component into the chassis. To remove the component from the chassis, the handle is pivoted away from the component which establishes a fulcrum to assist in the removal.

23 Claims, 3 Drawing Sheets

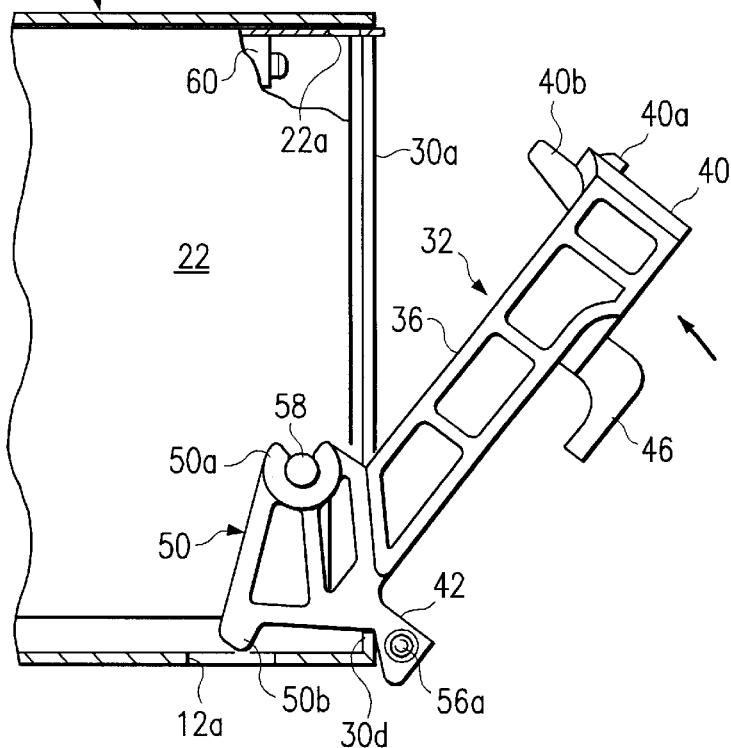
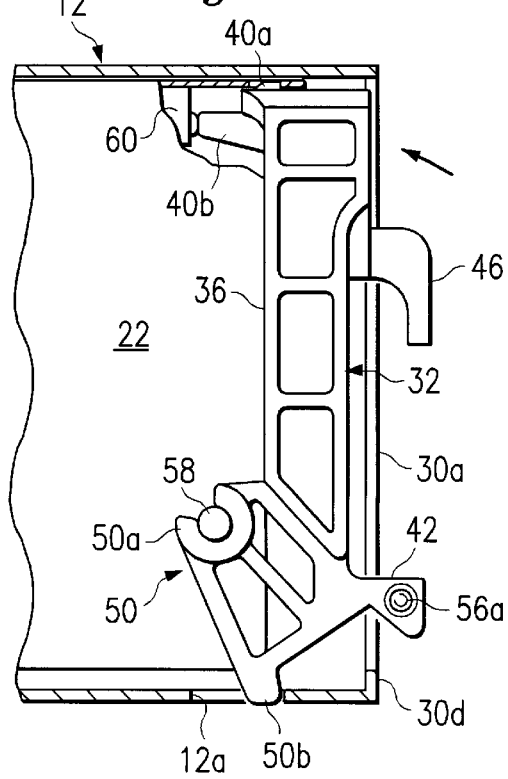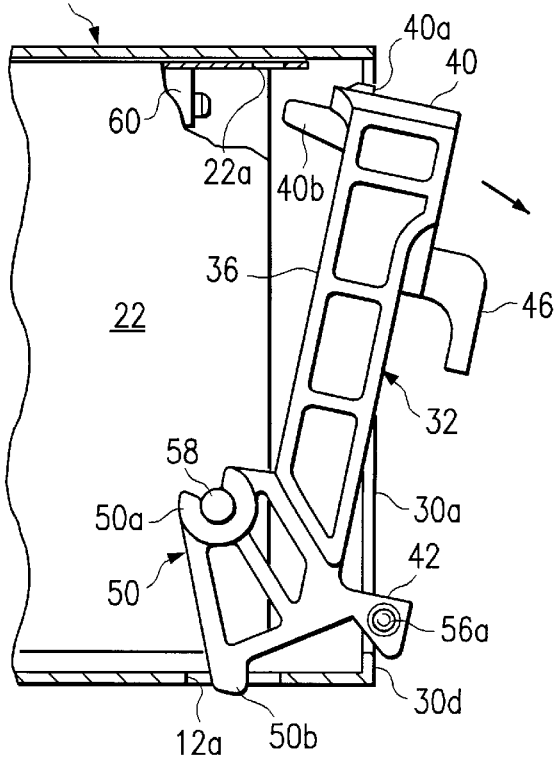

COMPUTER WITH COMPONENT INSTALLATION HANDLE

BACKGROUND

The invention relates generally to a computer and more particularly to a computer having a handle for installing a component into, and removing the component from, the chassis of the computer.

Computers, and many other types of electronic devices, include components, such as power supplies and the like, which are mounted in the chassis of the computer or electronic device. However, the mounting of components in the chassis often presents design and assembly challenges. For example, the power supply must be precisely located in the chassis and then advanced towards a connector mounted in the chassis with sufficient force to engage a connector on the power supply with the connector in the chassis. However it is often difficult to precisely locate the power supply in the chassis due to the relatively small amount of space that is available in the chassis and to create sufficient leverage to force the power supply connector into engagement with the connector in the chassis. Also, power supplies are often mounted directly onto the chassis using fasteners, such as screws, making it difficult to easily replace or remove the power supply for repair.

Therefore, what is needed is a handle for an electronic component, such as a power supply, which enables the component to be easily and quickly installed in the component chassis without the need for fasteners, and which creates leverage to force the connector on the component into mating engagement with the connector in the chassis and lock the electronic component in place, while enabling the component to be easily and quickly removed from the chassis.

SUMMARY

According to the present disclosure, a handle is pivotally mounted to a component, such as a power supply, for installing it in a chassis. After the component is inserted in the chassis, the handle is pivoted towards the component which establishes a fulcrum for forcing it further into the chassis. When the component is fully installed in the chassis, the handle is pivoted away from the component which establishes a fulcrum to assist in removing the component from the chassis.

Advantages are thus achieved with the foregoing, because the component can be easily and quickly installed and removed for service and replacement without the need for fasteners. Also, due to the forces established by the above-mentioned fulcrums, the connector of the component can be engaged with, and disengaged from, the connector in the chassis.

BRIEF DESCRIPTION OF THE DRAWINGS

FIGS. 4A–4C are side elevational views, depicting the handle of FIG. 3 and its corresponding power supply in different operational modes.

DESCRIPTION OF THE PREFERRED EMBODIMENT

Figure 1:
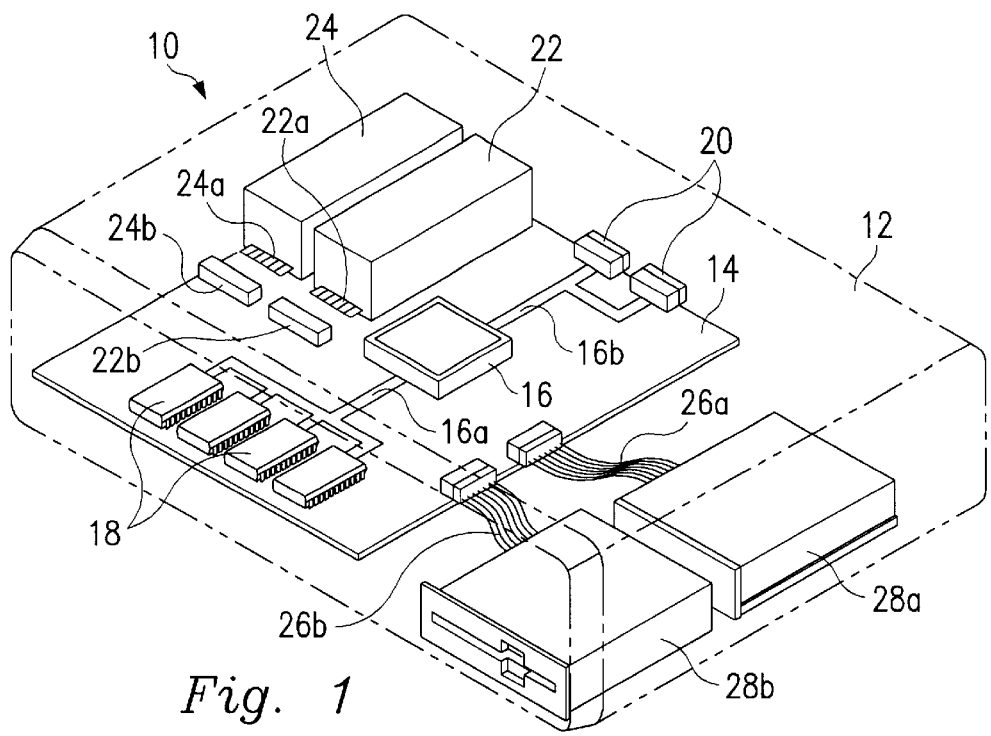
FIG. 1 is a diagrammatic representation of a computer according to an embodiment of the present disclosure.

An embodiment of the present disclosure is shown in FIG. 1 in connection with a computer, referred to, in general, by the reference numeral 10, which can be in the form of a server, a tower computer, a desktop computer, a laptop computer, or the like. The computer 10 includes a chassis 12 in which a motherboard 14 is mounted. A processor 16 is mounted on the motherboard 14 along with a plurality of memory devices, or modules, 18 and two input/output (I/O) devices 20. Two buses 16a and 16b are also provided on the motherboard 14 and connect the processor 16 to the memory modules 18 and to the input/output devices 20, respectively.

Two power supplies 22 and 24 are installed in the chassis 12 in a manner to be described. The power supplies 22 and 24 have connectors 22a and 24a extending from their respective rear surfaces which are adapted to extend in corresponding slot connectors 22b and 24b, respectively, disposed on the motherboard 14. A pair of cable assemblies 26a and 26b connect the motherboard to a hard drive unit 28a and a disk drive unit 28b, respectively. It is understood that other components, electrical traces, electrical circuits and related devices (not shown) are provided in the chassis 12. Because these are all conventional, they will not be described in any further detail.

Figure 2:
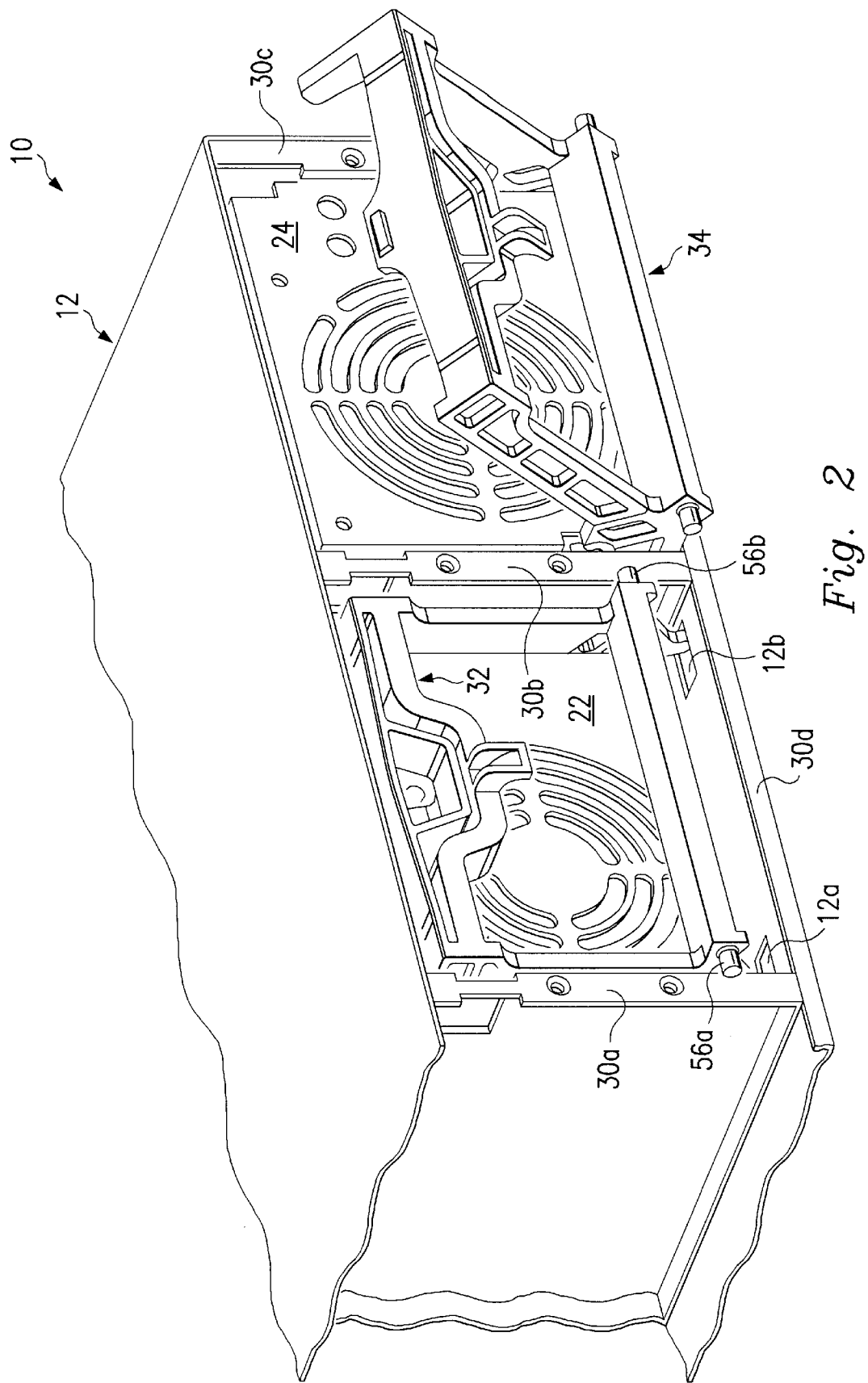
FIG. 2 is an isometric view of the computer of FIG. 1, taken from the rear thereof and showing two power supplies disposed in the chassis of the computer.

As shown in FIG. 2, the power supplies 22 and 24 are inserted into two large openings respectively formed in the rear wall of the chassis 12. The latter wall includes three spaced vertical surfaces 30a, 30b, and 30c and a horizontal surface 30d which define the above openings. In their mounted position, the respective front ends of the power supplies 22 and 24 extend slightly inwardly from the surfaces 30a–30d.

Two handles 32 and 34 are pivotally connected to the power supplies 22 and 24, respectively, and each functions to install and remove its corresponding power supply into and from the chassis 12 in a manner to be described. The power supply 22 and its handle 32 are shown in their fully installed position in FIG. 2, and the power supply 24 and the handle 34 are shown in a position during the installing operation.

Figure 3:
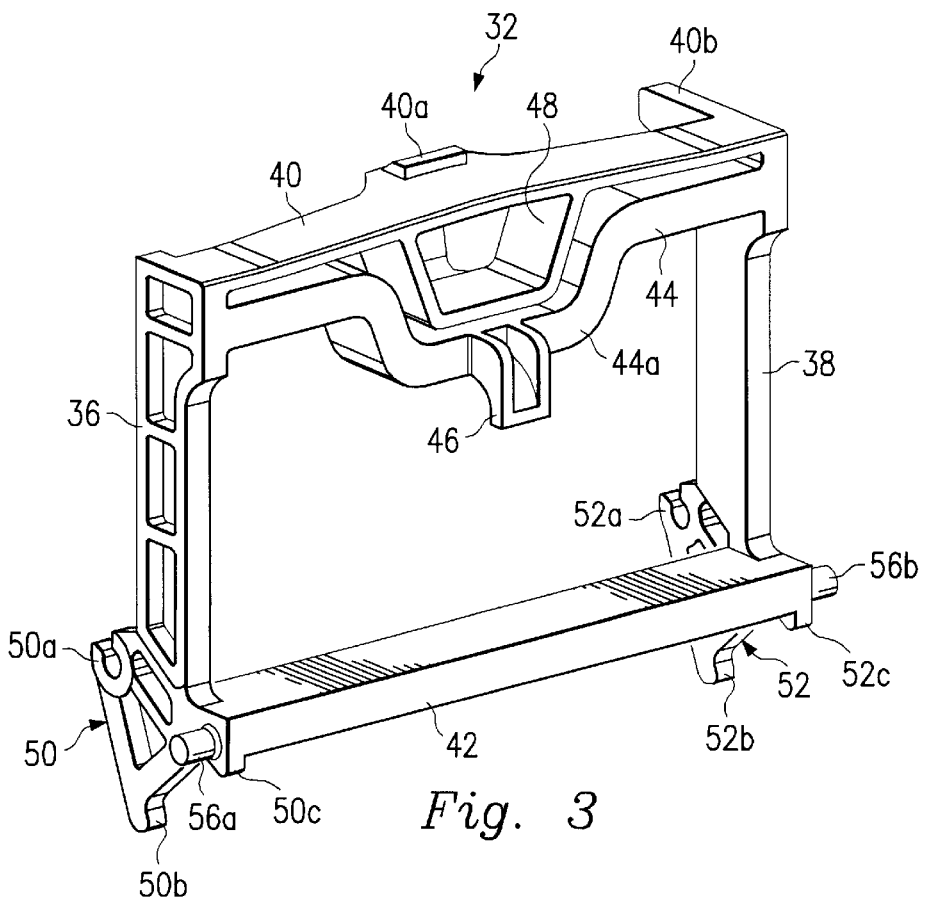
FIG. 3 is an enlarged isometric view of a handle that is used to install a power supply in the computer of FIGS. 1 and 3.

The handle 32 is shown in detail in FIG. 3 and is in the form of a rectangle having two side walls 36 and 38, an upper wall 40 as viewed in FIG. 3, and a lower wall 42. A partition 44 extends between the sidewalls 36 and 38 and parallel to the upper wall 40 and has a bent, extended, portion 44a from which a hook 46 extends. An additional partition 48, shaped in the form of a trapezoid, extends from the upper wall 40 and between the latter wall and the partition 44. The hook 46 and the partition 48 are adapted to be engaged by a person installing and removing the power supply 22 in a manner to be described.

A pair of levers 50 and 52 are disposed at the respective ends of the lower wall 42, and form a triangle including the latter wall and the corresponding lower end portions of the walls 36 and 38, respectively, of the handle 32. The levers 50 and 52 are identical and include C-shaped snap members 50a and 52a, respectively, at one apex thereof and extensions 50b and 52b, respectively, at another apex thereof. The functions of the snap members 50a and 52a, as well as the extensions 50b and 52b will be described later.

A flange 40a is formed on the upper portion of the upper wall 40 of the handle 32, and a flange 40b extends rearwardly from the latter wall at one end thereof. Two posts 56a and 56b extend from the respective ends of the lower wall 42. The functions of the flanges 40a and 40b and the posts 56a and 56b will be described in detail.

As shown in FIG. 2, a pair of slots 12a and 12b are formed through the floor, or bottom wall, of the chassis 12 and receive portions of the handle 32 during installation of the power supply 22.

With reference to FIGS. 3 and 4A, a push button switch 60 is mounted in the chassis 12 and extends adjacent the side wall of the power supply adjacent the wall 38 of the handle 32. The switch 60 functions to connect and disconnect the power supply 22 to a source of electrical power. To this end, the push button of the switch 60 is spring biased outwardly to the position shown in FIG. 4A in which the switch is in an electrically open position, and is adapted to be forced to a retracted, closed position to establish the connection under conditions to be described. Because the switch 60 is of a conventional design, it will not be described in any further detail.

FIGS. 4A–4C show three positions of the handle 32 during the installation of the power supply 22 in the chassis 12. To this end, a slot 22a extends through the upper wall of the power supply 22, and a pin 58 extends from a side wall of the power supply adjacent the wall 36 of the handle 32. It is understood that another pin (not shown) extends from the opposite side wall of the power supply. The functions of the slot 22a and the pins, including the pin 58, will be described in detail.

Before inserting the power supply 22 in the chassis 12, the snap member 50a of the handle 32 is snapped over the pin 58 of the power supply 22 as shown in FIG. 4A, and the snap member 50b is snapped over the above-mentioned pin on the opposite wall of the power supply. This attaches the handle 32 to the power supply 22, yet permits pivotal movement of the handle relative to the power supply.

The power supply 22, with the handle 32 attached thereto in the above manner, is then inserted in the opening between the vertical surfaces 30a and 30b (FIG. 2) and into the interior of the chassis 12. The power supply 22 is then advanced into the chassis 12 until the leading surface of the lower wall 42 of the handle 32 butts against the horizontal surface 30d of the chassis 12 as better shown in FIG. 4A. This sets the handle 32 at a precise angle relative to the rear surface of the power supply 22, so that the extensions 50b and 52b of the handle 32 are located just above the slots 12a and 12b, respectively of the chassis 12. In this position, the connector 22a (FIG. 1) on the rear end of the power supply 22 is close to, but not in engagement with, the corresponding connector 22b in the chassis 12.

The handle 32 is then pivoted about the pin 58 and the corresponding pin on the opposite wall of the power supply 22 in the direction shown by the arrow in FIG. 4B until the handle 32 reaches a vertical position shown in FIG. 4B. During this movement, the extensions 50b and 52b move into the slots 12a and 12b, respectively, of the chassis 12, and then act as fulcrums to cam, or force, the power supply 22 in a direction from right-to-left as viewed in FIG. 4A. This force is sufficient to engage the connector 22a (FIG. 1) on the power supply 22 with the corresponding connector 22b in the chassis 12. During this pivotal movement of the handle 32, the flange 40a engages, in a slight interference, the lower surface of the upper wall of the power supply 22 and flexes the wall upwardly until the flange reaches, and extends into, the slot 22a in the power supply. In this position, the extensions 50b and 52b of the handle 32 move to the rear portions of the slots 12a and 12b and engage the corresponding surfaces of the chassis 12 defining the latter portions.

The power supply 22 and the handle 32 are thus locked in their fully installed position shown in FIGS. 2 and 4B, with the handle 32 extending in an upright position parallel to the corresponding wall of the power supply 22. In this position of the handle 32, the flange 40b of the handle 32 engages the push button switch 60 to force the button of the switch to its retracted, closed position and thus electrically connect the power supply 22 to a source of electrical power.

It is noted from FIG. 4B, that, in the fully installed position of the power supply 22, the pin 56a is slightly spaced from the vertical surface 30a of the chassis 12. This is also true in connection with the pin 56b and the vertical surface 30b. The significance of this will be apparent from the following.

To remove the power supply 22 from the chassis 12 for replacement or repair, the handle 32 is initially pushed downwardly in the chassis by manually engaging the partition 44 and exerting a downwardly-directed force until the flange 40a clears the slot 22a. The hook 46 is then manually engaged and pulled in a direction indicated by the arrow in FIG. 4C to pivot the handle 32 a relatively short distance away from the power supply 22 until the pins 56a and 56b (FIG. 2) engage the vertical surfaces 30a and 30b, respectively, of the chassis 12. This establishes fulcrums between the pin 56a and the surface 30a as shown in FIG. 4C, and between the pin 56b and the surface 30b (FIG. 2). Therefore, upon further pivotal movement of the handle 32 away from the power supply 22 in the direction shown by the arrow in FIG. 4C, the fulcrums establish a force that assists in the removal of the power supply from the housing and is sufficient to disengage the connector 22a (FIG. 1) on the power supply 22 from its corresponding connector 22b in the chassis 12. During this movement, the flange 40b of the handle 32 disengages the push button switch 60 to allow the push button to move to its extended, open position and thus electrically disconnect the power supply 22 from the above-mentioned source of electrical power. This pivotal movement of the handle 32 continues until the power supply 22 can easily be manually removed from the chassis 12.

As a result of the above, the handle 32 enables the power supply 22 to be easily and quickly installed and locked in, and removed from, the computer chassis 12, while creating leverage that enables the power supply connector 22a to engage with, and disengage from, the connector 22b in the chassis. Also, the handle 32 can be used to carry the power supply 22 prior to installation in the chassis 12. It is understood that the handle 34 functions in an identical manner to install the power supply 24 in, and remove the power supply from, the chassis 12.

It is also understood that variations can be made in the foregoing without departing from the scope of the embodiments therein. For, example, the spatial references referred to above, such as "upper", "lower", "side", etc., are for illustration purposes only and are not intended to limit the specific location or orientation of any of the structure. Further, the device of the above embodiment is not limited to mounting a power supply in a computer, but is equally applicable for mounting any component in a chassis, or the like.

Other modifications, changes and substitutions are intended in the foregoing disclosure and in some instances some features of the disclosure will be employed without a corresponding use of other features. Accordingly, it is appropriate that the appended claims be construed broadly and in a manner consistent with the scope of the embodiments herein.

What is claimed is:

1. A computer comprising a chassis having at least one slot; at least one memory disposed in the chassis; at least one storage unit disposed in the chassis; at least one component; and a handle pivotally mounted to the component for installing the component in, and removing the component from, the chassis, the handle comprising a lever adapted to engage in the slot to establish a fulcrum so that pivotal movement of the handle relative to the component after the lever is engaged in the slot forces the component into the chassis, wherein the chassis comprises a bottom wall, wherein there are two of the slots extending through the bottom wall, and wherein the handle comprises two levers that respectively engage the slots.

2. The computer of claim 1 wherein the component has a slot extending through its top wall, and wherein the handle further comprises a flange adapted to engage in the latter slot when the component is fully installed in the chassis, to retain the handle relative to the component.

3. The computer of claim 1 wherein the handle is pivoted from the upright position to the angularly-extending position to remove the component from the chassis.

4. A computer comprising a chassis having at least one slot; at least one memory disposed in the chassis; at least one storage unit disposed in the chassis; at least one component; a handle pivotally mounted to the component for installing the component in, and removing the component from, the chassis, the handle comprising a lever adapted to engage in the slot to establish a fulcrum so that pivotal movement of the handle relative to the component after the lever is engaged in the slot forces the component into the chassis; a connector disposed in the chassis and a connector on the component for engaging the connector on the chassis; wherein, after the component is installed in the chassis, the handle can be pivotally movable relative to the component to remove the component from the chassis, and means for establishing a fulcrum in response to the latter pivotal movement to disengage the connector on the component from the connector in the chassis.

5. The computer of claim 4 wherein, after insertion of the component in the chassis, the handle is retained in an upright position in the chassis; and wherein the fulcrum-establishing means comprises at least one vertical surface formed on the chassis and at least one pin on the handle so that the latter pivotal movement of the handle causes the pin to engage the vertical surface to establish the fulcrum.

6. A computer comprising a chassis having at least one slot; at least one memory disposed in the chassis; at least one storage unit disposed in the chassis; at least one component; a handle pivotally mounted to the component for installing the component in, and removing the component from, the chassis, the handle comprising a lever adapted to engage in the slot to establish a fulcrum so that pivotal movement of the handle relative to the component after the lever is engaged in the slot forces the component into the chassis, wherein a front wall of the component is initially inserted in the chassis, and wherein the handle is pivoted from a position extending at an angle to the rear wall of the component to an upright position extending adjacent and parallel to the rear wall of the component to insert the component into the chassis; and means for retaining the handle in the upright position.

7. The computer of claim 6 further comprising a connector disposed in the chassis and a connector on the component for engaging the connector on the chassis.

8. The connector of claim 7 wherein the fulcrum-establishing means is established when the handle is pivoted towards the chassis to force the connector on the component into engagement with the connector on the chassis.

9. A computer comprising a chassis having at least one slot; at least one memory disposed in the chassis; at least one storage unit disposed in the chassis; at least one component; a handle pivotally mounted to the component for installing the component in, and removing the component from, the chassis, the handle comprising a lever adapted to engage in the slot to establish a fulcrum so that pivotal movement of the handle relative to the component after the lever is engaged in the slot forces the component into the chassis, the handle being pivoted towards the component to force the component into the chassis and away from the component to remove the component from the chassis; and a switch disposed on the chassis for electricity connecting and disconnecting the component to a source of electrical power, wherein the handle is adapted to engage the switch when the handle is pivoted towards the component to enable the switch to connect the component to the source.

10. The computer of claim 9 wherein, after the component is forced into the chassis, the handle can be pivoted away from the component to enable the component to be removed from the chassis and to enable the switch to disconnect the component from the source of electrical power.

11. The computer of claim 10 further comprising means for establishing a fulcrum between the handle and the component when the handle is pivoted away from the chassis after installation of the component in the chassis to force the connector on the component out of the connector on the chassis.

12. A handle for installing a component into, and removing the component from, a chassis, the handle comprising means for pivotally connecting the handle to the component; and a lever adapted to engage in a slot in the chassis to establish a fulcrum so that pivotal movement of the handle relative to the component after the lever is engaged in the slot forces the component into the chassis, wherein there are two of the slots extending through the bottom wall of the chassis, and wherein the handle comprises two levers that respectively engage the slots.

13. The handle of claim 12 wherein the component, with the handle pivotally attached thereto, is initially inserted into the chassis before the lever engages the slot, and wherein the pivotal movement forces the component into the chassis.

14. The handle of claim 12 wherein the component has a slot extending through its top wall, and wherein the handle further comprises a flange adapted to engage in the latter slot when the component is fully installed in the chassis, to retain the handle relative to the component.

15. The handle of claim 12 wherein, after the component is installed in the chassis, the handle can be pivotally movable relative to the component to remove the component from the chassis, and further comprising means for establishing a fulcrum in response to the latter pivotal movement to assist in the removal of the component from the chassis.

16. A handle for installing a component into, and removing the component from, a chassis, the handle comprising means for pivotally connecting the handle to the component; a lever adapted to engage in a slot in the chassis to establish a fulcrum so that pivotal movement of the handle relative to the component after the lever is engaged in the slot forces the component into the chassis, wherein, after the component is installed in the chassis, the handle can be pivotally movable relative to the component to remove the component from the chassis; and means for establishing a fulcrum in response to the latter pivotal movement to assist in the removal of the component from the chassis, wherein, after insertion of the component in the chassis, the handle is retained in an upright position in the chassis; and wherein the fulcrum-establishing means comprises at least one vertical surface formed on the chassis and at least one pin on the handle so that the latter pivotal movement of the handle causes the pin to engage the vertical surface to establish the fulcrum.

17. The handle of claim 16 wherein a front wall of the component is initially inserted in the chassis, and wherein the handle is pivoted from a position extending at an angle to the rear wall of the component to an upright position extending adjacent and parallel to the real wall of the component to insert the component into the chassis.

18. The handle of claim 17 wherein the handle is pivoted from the upright position to the angularly-extending position to remove the component from the chassis.

19. The handle of claim 17 further comprising means for retaining the handle in the upright position.

20. The handle of claim 16 wherein the fulcrum-establishing means forces a connector on the component into engagement with a connector on the chassis.

21. The handle of claim 16 wherein the handle is pivoted towards the component to force the component into the chassis and away from the component to remove the component from the chassis.

22. The handle of claim 21 wherein the handle further comprises a flange adapted to engage a switch on the chassis when the handle is pivoted towards the component.

23. The handle of claim 16 further comprising means for establishing a fulcrum between the handle and the component when the handle is pivoted away from the chassis after installation of the component in the chassis to force the component from the chassis.

* * * * *